(12) United States Patent
Kujirai

(10) Patent No.: US 7,816,208 B2
(45) Date of Patent: Oct. 19, 2010

(54) METHOD OF MANUFACTURING SEMICONDUCTOR DEVICE HAVING TRENCH-GATE TRANSISTOR

(75) Inventor: Hiroshi Kujirai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 531 days.

(21) Appl. No.: 11/822,458

(22) Filed: Jul. 6, 2007

(65) Prior Publication Data
US 2008/0012053 A1 Jan. 17, 2008

(30) Foreign Application Priority Data
Jul. 13, 2006 (JP) ............... 2006-192456

(51) Int. Cl.
*H01L 21/8234* (2006.01)
(52) U.S. Cl. .................. 438/259; 438/270; 438/294; 438/400; 257/E21.384
(58) Field of Classification Search ........... 438/270, 438/259, 294, 400, 196, 206; 257/E21.384
See application file for complete search history.

(56) References Cited

U.S. PATENT DOCUMENTS

| 5,502,320 | A | 3/1996 | Yamada |
| 6,770,535 | B2 | 8/2004 | Yamada et al. |
| 7,285,466 | B2 * | 10/2007 | Kim et al. ............ 438/270 |
| 2004/0224476 | A1 | 11/2004 | Yamada et al. |
| 2005/0014338 | A1 | 1/2005 | Kim et al. |
| 2005/0250284 | A1 * | 11/2005 | Park ................ 438/270 |
| 2006/0192249 | A1 | 8/2006 | Kim et al. |

FOREIGN PATENT DOCUMENTS

| JP | 02-081472 | 3/1990 |
| JP | 06-268174 | 9/1994 |
| JP | 08-274277 | 10/1996 |
| JP | 2001-210801 A | 8/2001 |
| JP | 2005-039270 A | 2/2005 |
| JP | 2005-322880 A | 11/2005 |
| JP | 2006-295180 A | 10/2006 |

* cited by examiner

*Primary Examiner*—Asok K Sarkar
*Assistant Examiner*—Julia Slutsker
(74) *Attorney, Agent, or Firm*—Foley & Lardner LLP

(57) ABSTRACT

A method of manufacturing a semiconductor device includes: a first step of forming an STI region and an active region surrounded by the STI region on a semiconductor substrate; a second step of forming a protection film protecting a shoulder part of the STI region in a boundary between the active region and the STI region; a third step of forming a gate trench in the active region so as to leave a part of the semiconductor substrate located between a side surface of the STI region and a side surface of the gate trench;

a fourth step of forming a gate insulating film on the side surface of the gate trench; a fifth step of forming a gate electrode, at least a part of the gate electrode being buried in the gate trench; and a sixth step of forming a source region and a drain region in regions located on both sides of the gate trench in an extension direction of the gate trench, respectively, so that the part of the semiconductor substrate functions as a channel region.

19 Claims, 21 Drawing Sheets

SECTION A-A'  SECTION B-B'  SECTION C-C'

SECTION A-A'

SECTION D-D'

US 7,816,208 B2

METHOD OF MANUFACTURING SEMICONDUCTOR DEVICE HAVING TRENCH-GATE TRANSISTOR

TECHNICAL FIELD

The present invention relates to a semiconductor device manufacturing method, and particularly relates to a method of manufacturing a semiconductor device including a trench-gate transistor.

BACKGROUND OF THE INVENTION

In recent years, following downsizing of a memory cell in a DRAM (Dynamic Random Access Memory), a gate length of a memory cell transistor is inevitably reduced. However, if the gate length is smaller, then the short channel effect of the transistor disadvantageously becomes more conspicuous, and sub-threshold current is disadvantageously increased. Furthermore, if substrate concentration is increased to suppress the short channel effect and the increase of the sub-threshold current, junction leakage increases. Due to this, the DRAM is confronted with a serious problem of deterioration in refresh characteristics.

To avoid the problem, attention is paid to a so-called trench-gate transistor (also called as "recess-channel transistor") configured so that a gate electrode is buried in each trench formed in a semiconductor substrate. According to the trench-gate transistor, it is possible to physically sufficiently secure an effective channel length (gate length) and realize a small-sized DRAM a minimum processing size of which is equal to or smaller than 90 nm.

Moreover, a method of forming a three-dimensional SOI (Silicon On Insulator) structure in each trench and using a silicon layer in the SOI structure as a channel region is proposed in Japanese Patent Application Laid-Open No. H8-274277.

However, the conventional trench-gate transistor has the following problems. Although the short channel effect can be suppressed, it is necessary to further improve the trench-gate transistor for suppression of junction leakage current, reduction in power supply voltage and the like.

SUMMARY OF THE INVENTION

Therefore, it is an object of the present invention to provide a method of manufacturing a semiconductor device having a trench-gate transistor which can suppress junction leakage current, reduce power supply voltage and reduce characteristic irregularities among a plurality of transistors.

It is another object of the present invention to provide a method of manufacturing a semiconductor device having a trench-gate transistor in which a channel region is completely depleted.

The method of manufacturing the semiconductor device according to the present invention includes:

a first step of forming an STI (Shallow Trench Isolation) region includes a first insulating film and an active region surrounded by the STI region on a semiconductor substrate so that an upper end of the first insulating film is lapped on an upper end of the active region and so as to include a shoulder part almost perpendicular to the semiconductor substrate in a direction crossing the active region;

a second step of forming a second insulating film and a third insulating film in this order on an entire surface including the shoulder part;

a third step of forming a fourth insulating film on the third insulating film, the fourth insulating film serving as a hard mask when a gate trench is formed;

a fourth step of performing a dry etching using the third insulating film as a stopper, and forming an opening in the fourth insulating film, the opening corresponding to a width of the gate trench;

a fifth step of sequentially removing the third insulating film and the second insulating film exposed to a bottom of the opening; and a sixth step of forming the gate trench in the semiconductor substrate using the fourth insulating film as a mask in a direction almost parallel to the active region, forming the gate trench using the shoulder part of the STI region as a mask in an extension direction of the gate trench, and leaving a thin film part that is a part of the semiconductor substrate between the gate trench and the STI region.

As described above, according to the present invention, the upper end of the first insulating film for forming the STI region is made to include the shoulder part almost perpendicular to the semiconductor substrate, and the shoulder part is covered with the second and third insulating films. By doing so, in the dry etching for forming the opening in the fourth insulating film, the shoulder part of the first insulating film is protected. Therefore, the shoulder part of the first insulating film is not chipped. When the gate trench is formed by etching the semiconductor substrate using the shoulder part as a mask, a part of the semiconductor substrate left as a thin film part between the gate trench and the STI region can be prevented from being tapered on the gate trench side. It is thereby possible to improve uniformity in thickness and width of the thin film part to serve as the channel region of each transistor. Accordingly, characteristic irregularities among a plurality of transistors can be reduced.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

To improve the semiconductor device including the trench-gate transistor, the present inventor was dedicated to various studies and considerations before the present invention is invented. Consequently, a related art proposed by the present inventor will be firstly explained below.

Figure 18A:
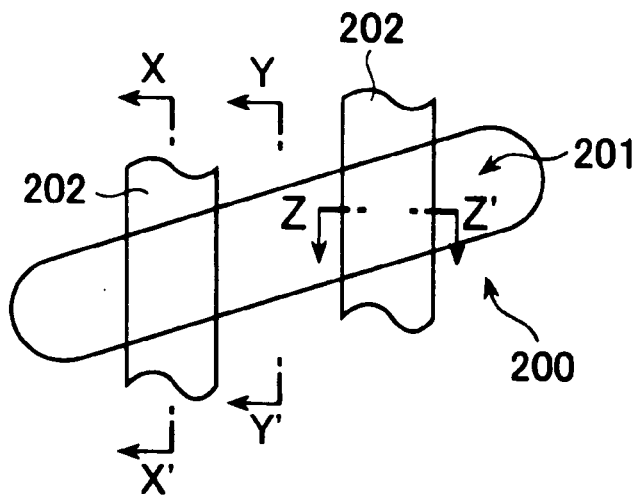
FIGS. 18A and 18B are respectively a plan view and a sectional view for explaining a method of manufacturing a semiconductor device according to a related art.
Figure 18B:
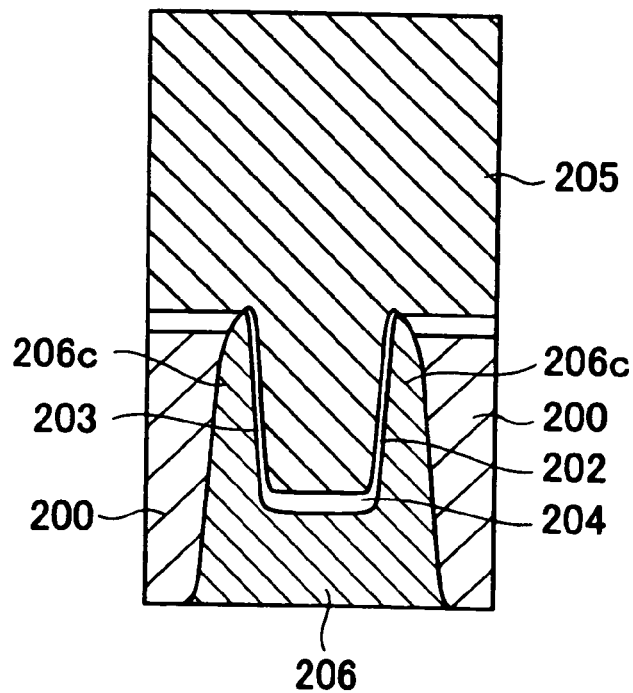

FIGS. 18A and 18B are views for explaining a structure of a semiconductor device according to the related art. FIG. 18A is a generally plan view and FIG. 18B is a generally cross-sectional view taken along a line X-X' shown in FIG. 18A.

As shown in FIG. 18A, gate trenches 202 are formed in one direction to cross an active region 201 surrounded by an STI (Shallow Trench Isolation) region 200. As shown in FIG. 18B, gate insulating films 203 are formed on side surfaces of each of the gate trenches 202, an insulating film 204 thicker than the gate insulating films 203 is formed on a bottom of each of the gate trenches 202, and a gate electrode 205 is formed in each gate trench 202. A part 206c of a semiconductor substrate 206 located between a side surface of the STI region 200 and a side surface of each gate trench 200 is thereby allowed to function as a channel region. Because the channel regions 206 can be formed quite thin, complete depletion can be realized as seen in the SOI structure.

However, a method of manufacturing the semiconductor device configured as stated above for the related art has problems of deteriorations in uniformity of thicknesses of the channel regions 206c and in controllability over a channel width (a depth of a part constituting the SOI structure). The problems will be described below with reference to FIGS. 19 to 21.

Figure 19:
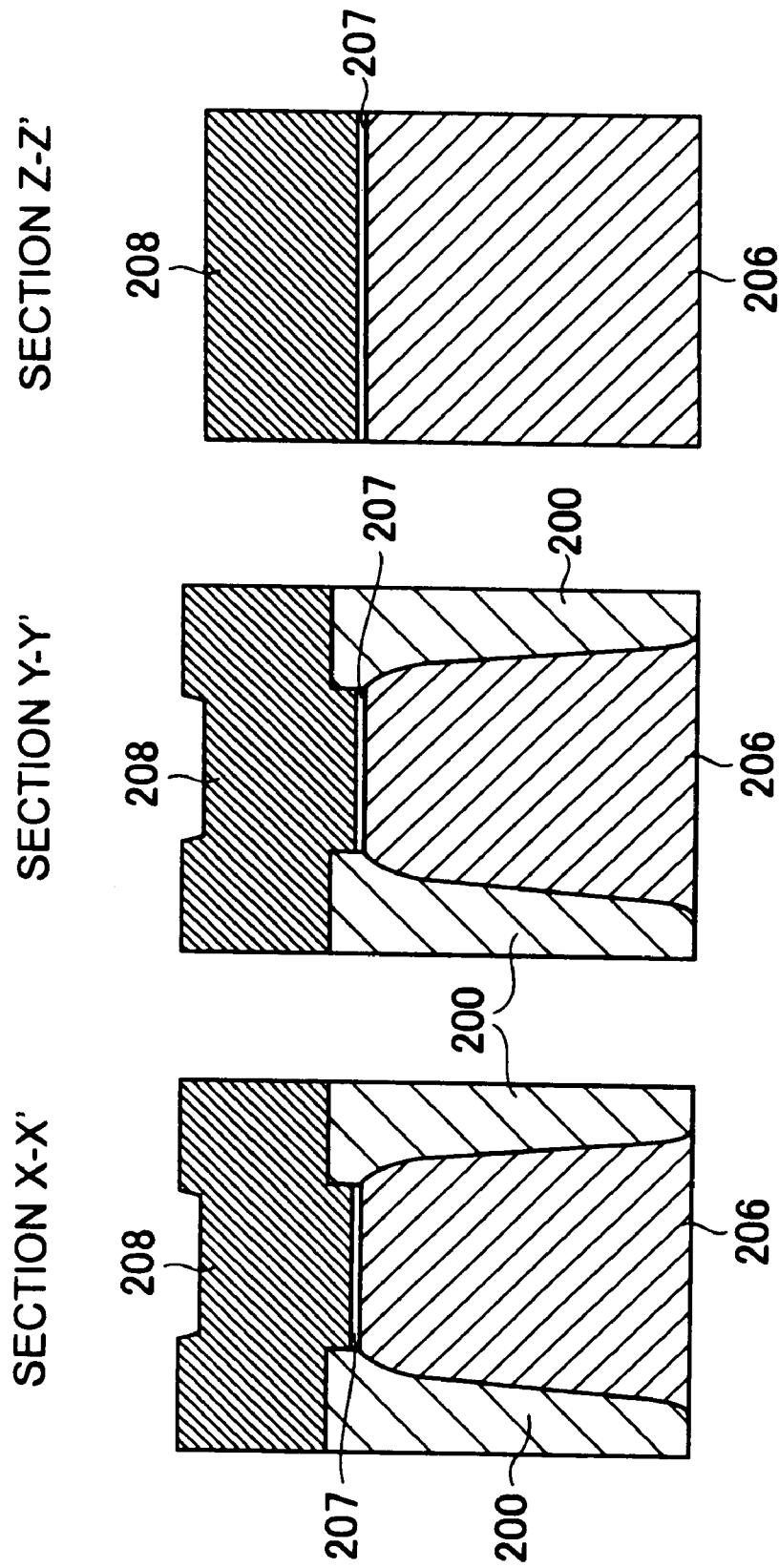
FIG. 19 is a cross-sectional view showing one process (formation of a silicon nitride film 208) in the method of manufacturing the semiconductor device according to the related art.
Figure 20:
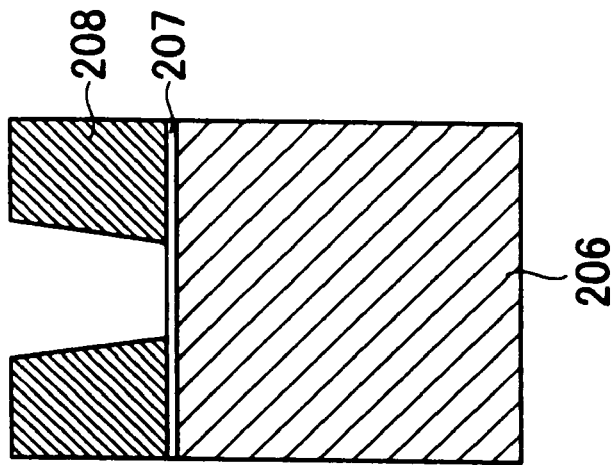
FIG. 20 is a cross-sectional view showing one process (patterning of the silicon nitride film 208) in the method of manufacturing the semiconductor device according to the related art.
Figure 20:
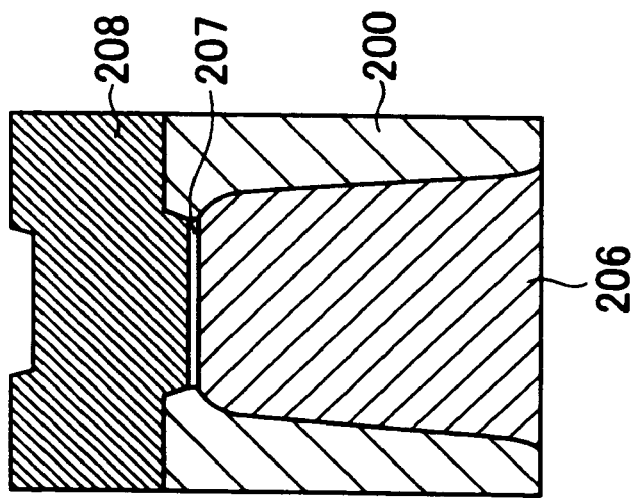
Figure 20:
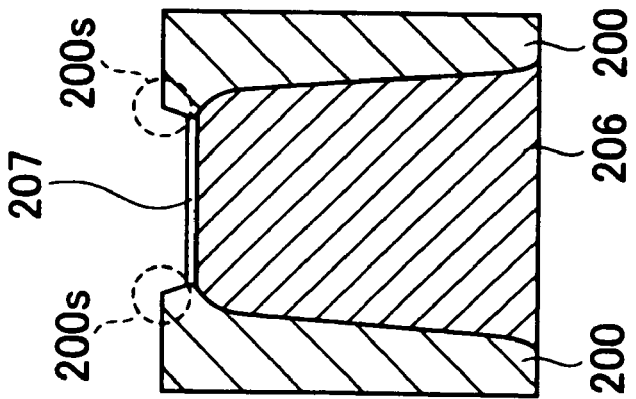
Figure 21:
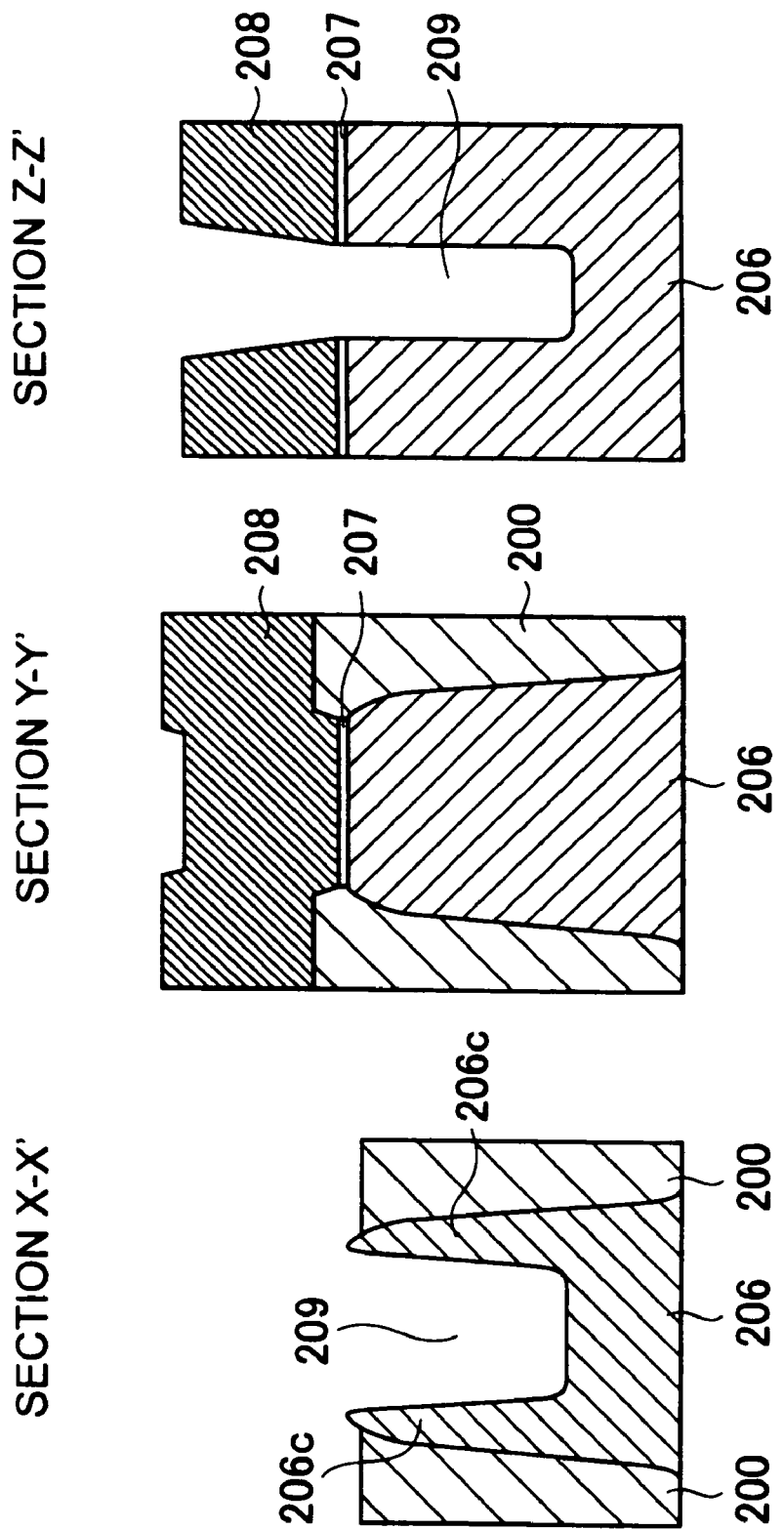
FIG. 21 is a cross-sectional view showing one process (formation of a gate trench 209) in the method of manufacturing the semiconductor device according to the related art.

FIGS. 19 to 21 are step views schematically showing steps of forming the gate trenches in the steps of manufacturing the semiconductor device shown in FIGS. 18A and 18B. In each of FIGS. 19 to 21, three cross sectional views from the left correspond to a section X-X', a section Y-Y', and a section Z-Z' taken along lines X-X', Y-Y', and Z-Z' of FIG. 18A, respectively.

As shown in FIG. 19, a pad oxide film 207 is formed on a surface of the semiconductor substrate 206, and a silicon oxide film 200 to serve as the STI region 200 is formed in the semiconductor substrate 206. A silicon nitride film 208 to serve as a mask during formation of gate trenches 209 (see FIG. 21) is formed on an entire surface of the semiconductor substrate 206.

As shown in FIG. 20, the silicon nitride film 208 is dry-etched while using a resist film (not shown) as a mask, thereby forming openings each having a width equal to that of each gate trenches 209. At this time, as shown in the section X-X' of FIG. 20, tapered parts 200s are left on upper ends of the silicon oxide film 200 to serve as the STI region 200.

Next, as shown in the section Z-Z' of FIG. 21, dry etching is performed while using the silicon nitride film 208 as a mask, thereby forming the gate trenches 209 in the semiconductor substrate 206.

The dry etching for forming the gate trenches 209 has a high selectivity with respect to not only the silicon nitride film 208 but also the silicon oxide film 200. Due to this, because of the presence of the tapered parts 200s (see FIG. 20) of the silicon oxide film 200, the tapered parts 200s function as a mask. As shown in the section X-X' of FIG. 21, a tapered shape is also reflected in each gate trench 209. In this manner, the channel regions 206c shown in FIG. 18B are formed.

The reason that the upper ends of the silicon oxide film 200 become tapered is considered as follows. Corners of the silicon oxide film 200 exposed when the silicon nitride film 208 is patterned are chipped. States of chipping the corners of the silicon oxide film 200 to form the tapered parts 200s during dry etching differ among respective parts. Due to this, thicknesses and channel widths (depths of parts constituting the SOI structure) of the channel regions 206c are not uniform among a plurality of transistors. This results in irregularity in transistor characteristics.

Therefore, it is provided by the present invention that a method of manufacturing a semiconductor device in which a thin film part of silicon formed between an STI region and a gate trench is used as a channel region, and which can improve uniformities in thickness and width of the thin film part.

Preferred embodiments of the present invention will be explained below with reference to the accompanying drawings.

Note that the following embodiment is an example of applying the present invention to a memory cell transistor in a DRAM.

A configuration of the memory cell transistor in the DRAM formed according to the embodiment of the present invention will first be described in detail.

Figure 1A:
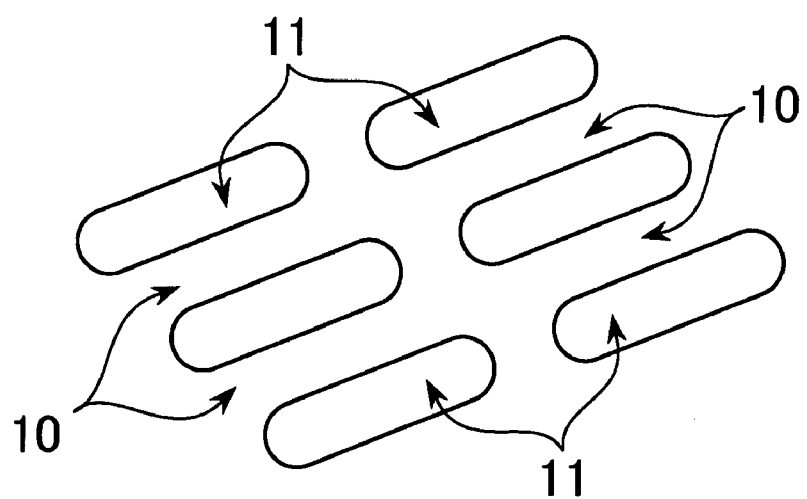
FIGS. 1A and 1B are plan views for explaining a method of manufacturing a semiconductor device according to an embodiment of the present invention.

FIG. 1A is a plan view showing an STI region (an element isolation region) 10 and a plurality of active regions 11 separated from one another by the STI region 10 in a memory cell region according to the embodiment. Generally, a plurality of active regions are arranged almost equally in the memory cell region. The same is true for the embodiment as shown in FIG. 1A.

Figure 1B:
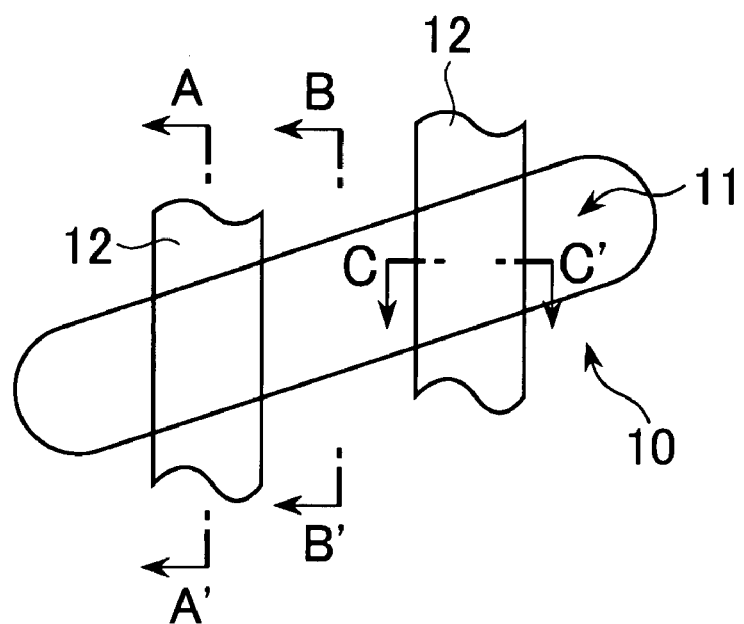

FIG. 1B is a plan view showing one of the active regions 11 shown in FIG. 1A and the STI region 11 around the active region 11. Gate trenches 12 are formed in one direction to cross the active region 11.

Figure 2:
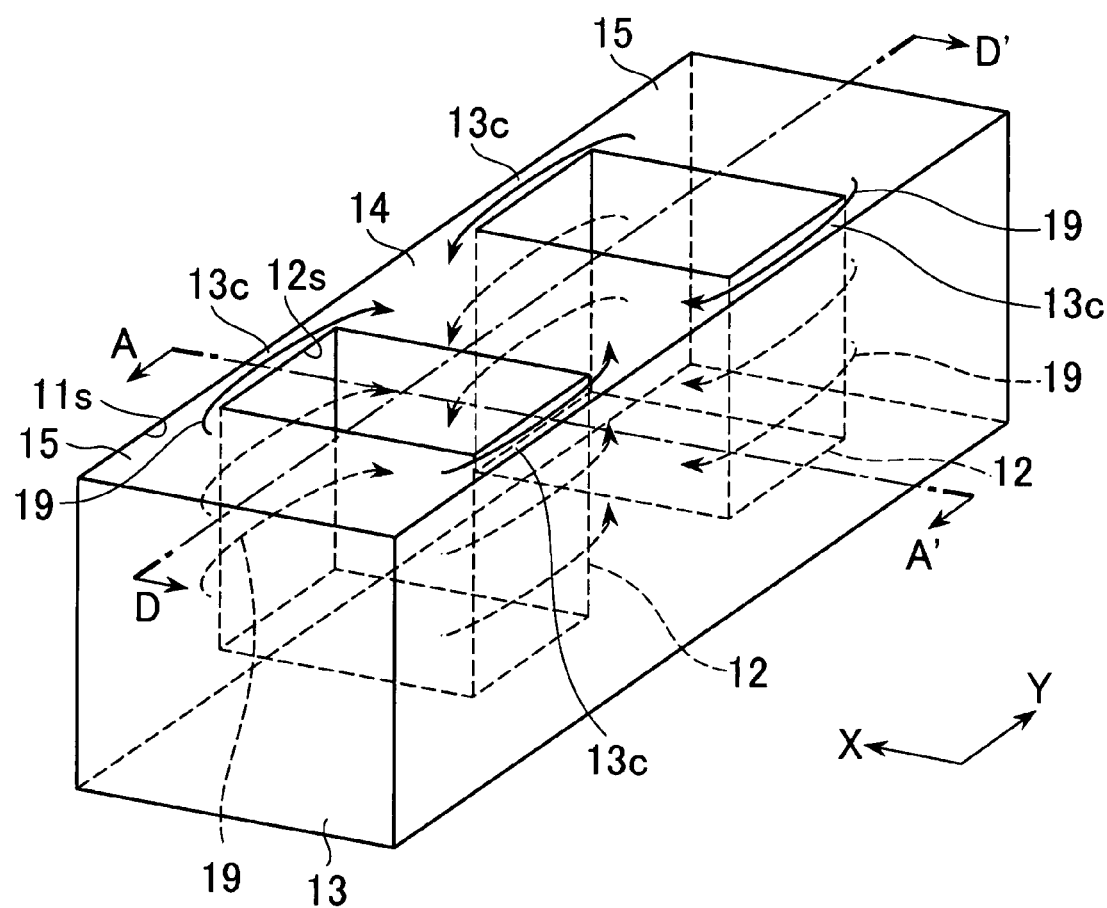
FIG. 2 is a pattern diagram for explaining a structure of a memory cell transistor in the method of manufacturing the semiconductor device according to the embodiment of the present invention.

FIG. 2 is a pattern diagram for explaining a structure of the memory cell transistor according to the embodiment. FIG. 2 corresponds to the active region 11 shown in FIG. 1B.

As shown in FIG. 2, a part 13c of a semiconductor substrate (silicon substrate) 13 is present between a side surface 11s of the active region 11 (that is, a side surface of the STI region 10) and a side surface 12s of each of the gate trenches 12 in an extension direction X of the gate trenches 12. Furthermore, parts located on both sides of each of the gate trenches 12 in the extension direction X of the gate trenches 12 are a source region 14 and a drain region 15 (also referred to as "first and second diffusion layer regions"), respectively. In the embodiment, because the present invention is applied to the memory cell transistor in the DRAM, the source region and the drain region are often reversed depending on whether a read-in operation or a read-out operation is performed. In the embodiment, it is assumed that a central region is the source region 14, regions on both sides of the central region are the drain regions 15, and that the memory cell transistor is an N-channel transistor.

Figure 3A:
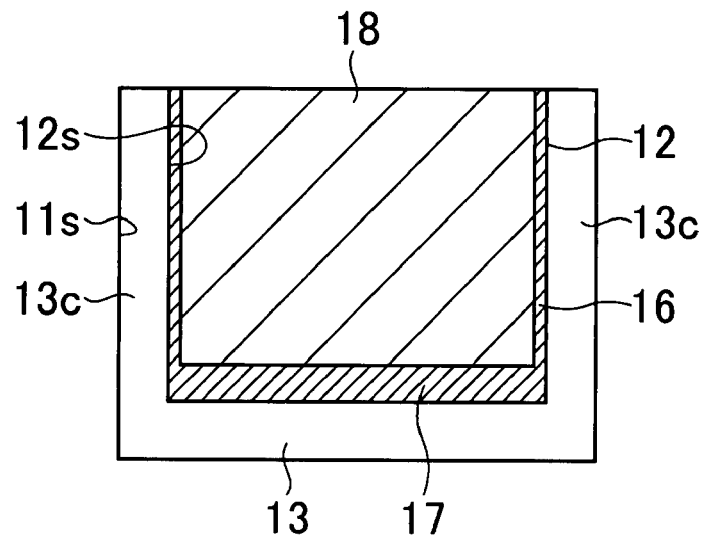
FIG. 3A and FIG. 3B are respectively a cross-sectional view taken along a line A-A' in FIG. 2 and a cross-sectional view taken along a line D-D' in FIG. 2.
Figure 3B:
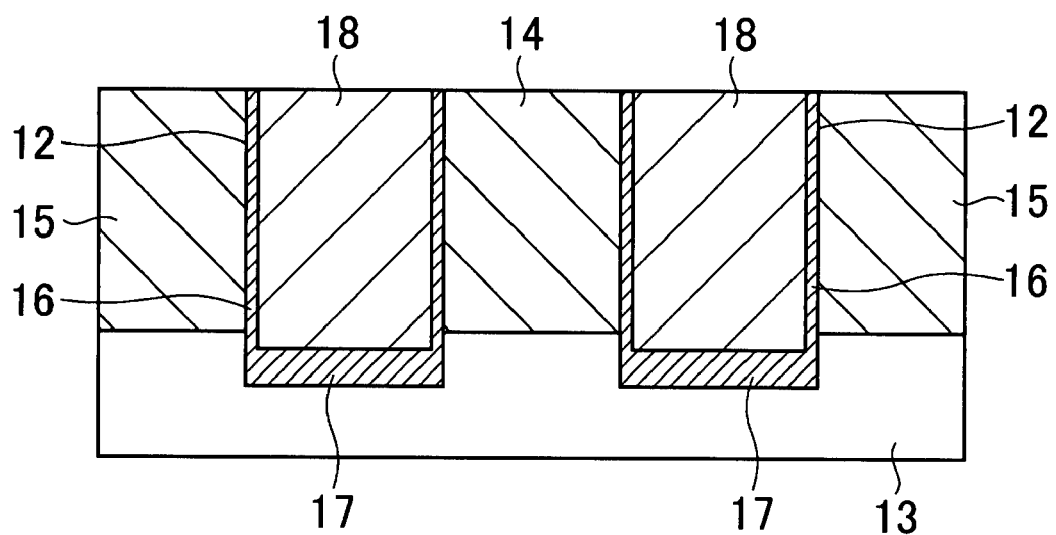

Although not shown in FIG. 2 for brevity, a gate insulating film 16 is provided on a side surface of each gate trench 12 as shown in FIG. 3A that is a generally cross-sectional view taken along a line A-A' of FIG. 2 and FIG. 3B that is the generally cross-sectional view taken along a line D-D' of FIG. 2. Moreover, as shown in FIG. 3, an insulating film 17 thicker than the gate insulating film 16 is provided on a bottom of each gate trench 12. A trench gate electrode 18 is buried in each gate trench 12 as shown in FIG. 3.

With such a structure, the parts 13c (of the semiconductor substrate 13) each present between the side surface 11s of each of the active regions 11 (that is, the side surface of the STI region 10 as shown in FIGS. 1A and 1B) and the side surface 12s of each of the gate trenches 12 and formed flat and thin almost parallel to the side surface of each STI region 10 are allowed to function as channel regions, respectively. Namely, the memory cell transistor is structured so that a current is carried across the side surface portions of the gate trenches 12 adjacent to the STI region 10 in a Y direction as indicated by arrows 19 shown in FIG. 2 when a potential difference between the gate electrode 18 and the source region 14 shown in FIG. 3B exceeds a threshold voltage. One of surfaces of each channel region 13c contacts with each STI region 10 and the other surface thereof contacts with the gate insulating film 16. In other words, only the channel region 13c that is a part of the semiconductor substrate 13 is present between the STI region 10 and the gate insulating film 16.

The parts 13c, i.e., the channel regions 13c present between the side surfaces 11s and 12s can be formed to be quite thin. Therefore, it is possible to make the channel regions 13c completely depleted as seen in the SOI structure. A thickness of each of the channel regions 13c is preferably equal to or larger than 5 nm and equal to or smaller than 25 nm for realizing complete depletion.

Moreover, because the insulating film 17 thicker than the gate insulating film 16 is provided on the bottom of each gate trench 12, it is difficult to form an inversion layer, i.e., a channel on the bottom of each gate trench 12. The thick insulating film 17 is set to have a thickness to the extent that no channel is formed on the semiconductor substrate 13 under each gate trench 12. Therefore, only the parts 13c located between the side surfaces 11s of the active region 11 (that is, side surfaces of the STI region 10) and the side surfaces 12s of the gate trenches 12 can function as the channel regions of the memory cell transistor. As a result, it is possible to suppress junction leakage and improve refresh characteristics.

With reference to FIGS. 4 to 17, a method of manufacturing a semiconductor device according to the embodiment will be described in detail. FIGS. 4 to 17 are step views schematically showing steps of manufacturing the semiconductor device according to the embodiment. In each of FIGS. 4 to 17, cross-sectional views from the left correspond to a section A-A', a section B-B', and a section C-C' shown in FIG. 1B, respectively.

Figure 4:
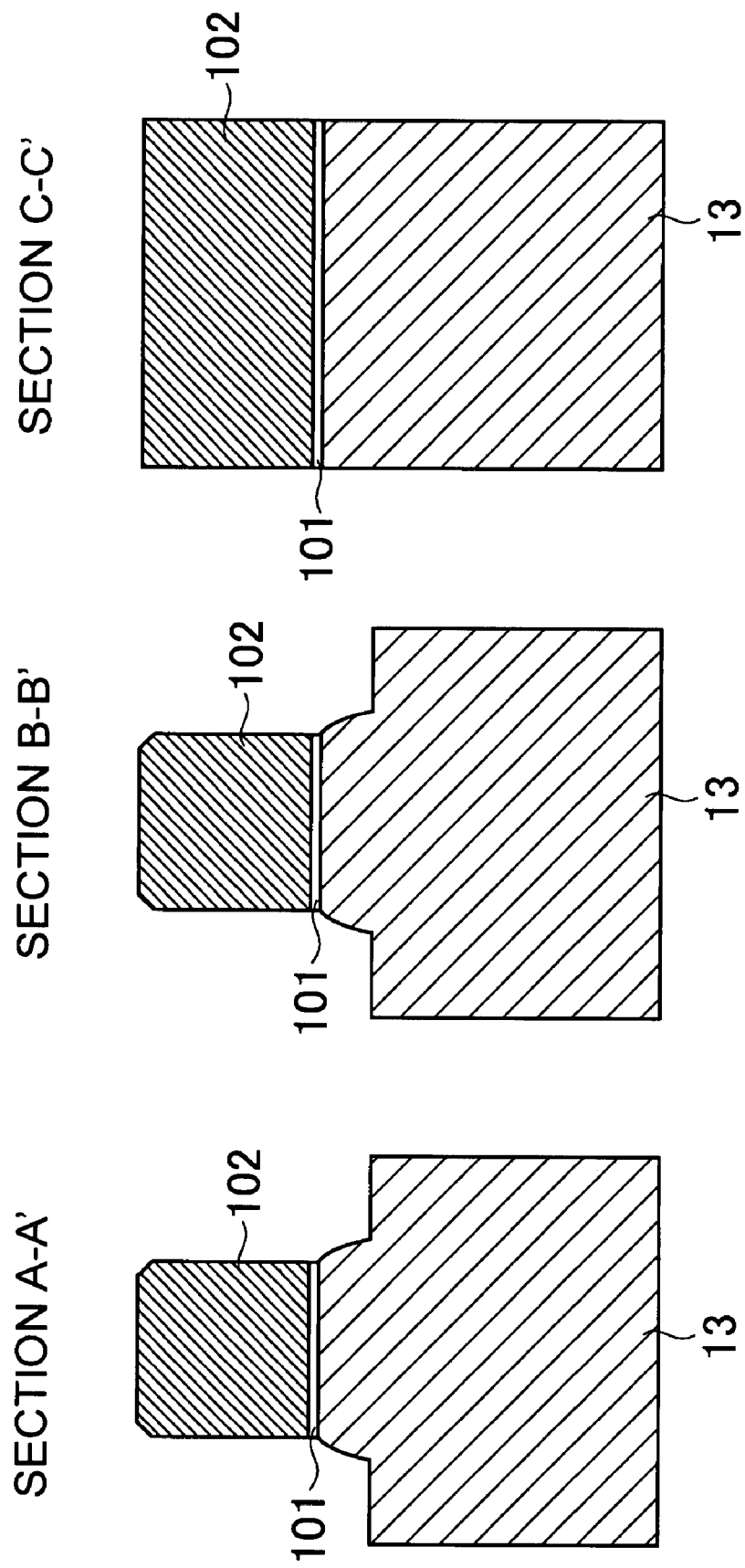
FIG. 4 is a cross-sectional view showing one process (patterning of a pad oxide film 101 and a silicon nitride film 102) in the method of manufacturing the semiconductor device according to the embodiment of the present invention.

As shown in FIG. 4, a pad oxide film 101 having a thickness of about 9 nm and a silicon nitride film 102 having a thickness of about 120 nm are formed on the semiconductor substrate 13. The pad oxide film 101 and the silicon nitride film 102 are dry-etched and patterned into shape corresponding to the active region 11 shown in FIGS. 1A and 1B by well-known photolithography. At this time, because over-etching is performed, a surface of the semiconductor substrate 13 is slightly etched as shown in the section A-A' and the section B-B'.

Figure 5:
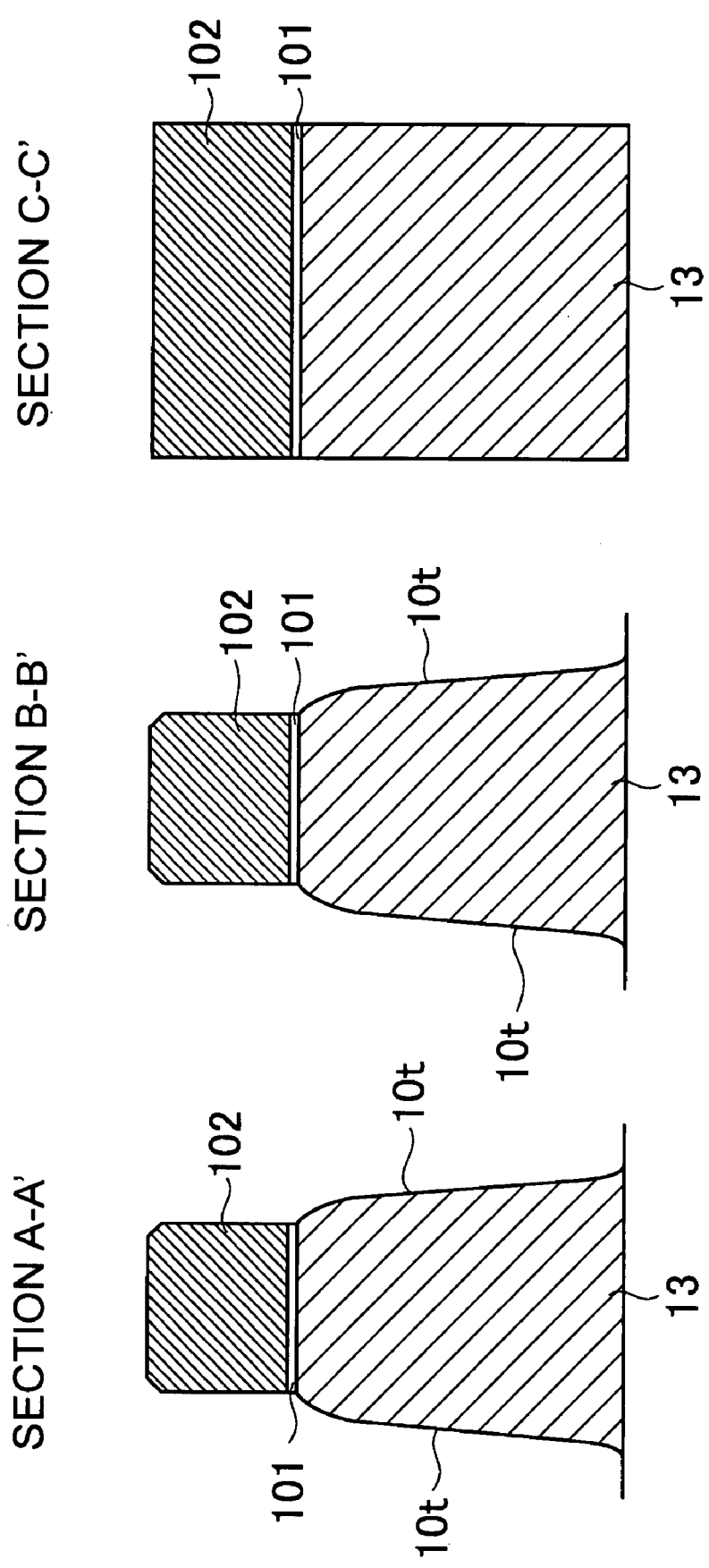
FIG. 5 is a cross-sectional view showing one process (formation of a trench 10t for STI) in the method of manufacturing the semiconductor device according to the embodiment of the present invention.

As shown in FIG. 5, while using the silicon nitride film 102 as a mask, an STI trench 10t having a depth of about 250 nm are formed in the semiconductor substrate 13. At this time, an upper surface of the silicon nitride film 102 is chipped by about 50 nm.

Figure 6:
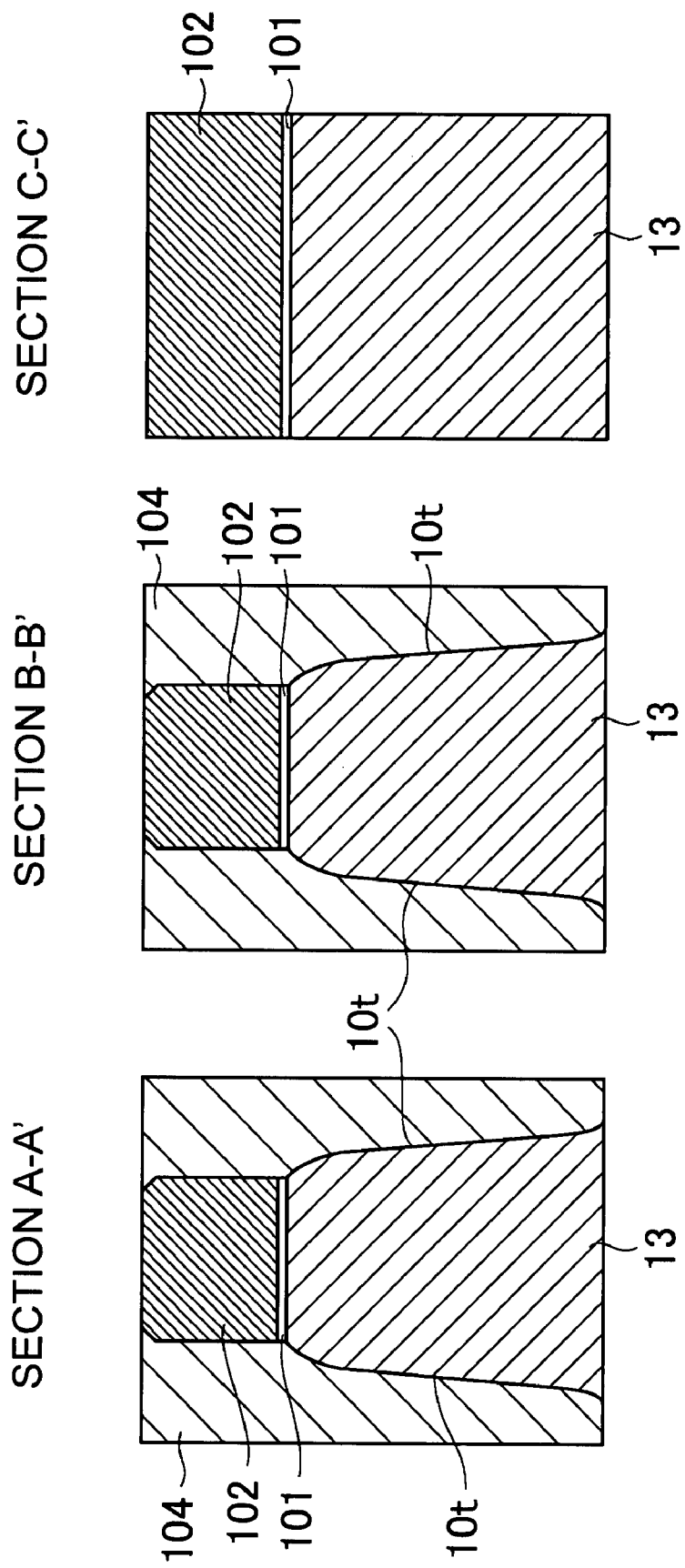
FIG. 6 is a cross-sectional view showing one process (formation of a silicon oxide film 104) in the method of manufacturing the semiconductor device according to the embodiment of the present invention.

As shown in FIG. 6, a silicon oxide film 104 having a thickness of about 400 nm is formed on an entire surface including interior of the trench 10t by HDP-CVD (High Density Plasma-Chemical Vapor Deposition). Thereafter, the silicon oxide film 104 is polished and removed by CMP (Chemical Mechanical Polishing) while using the silicon nitride film 102 as a stopper.

Figure 7:
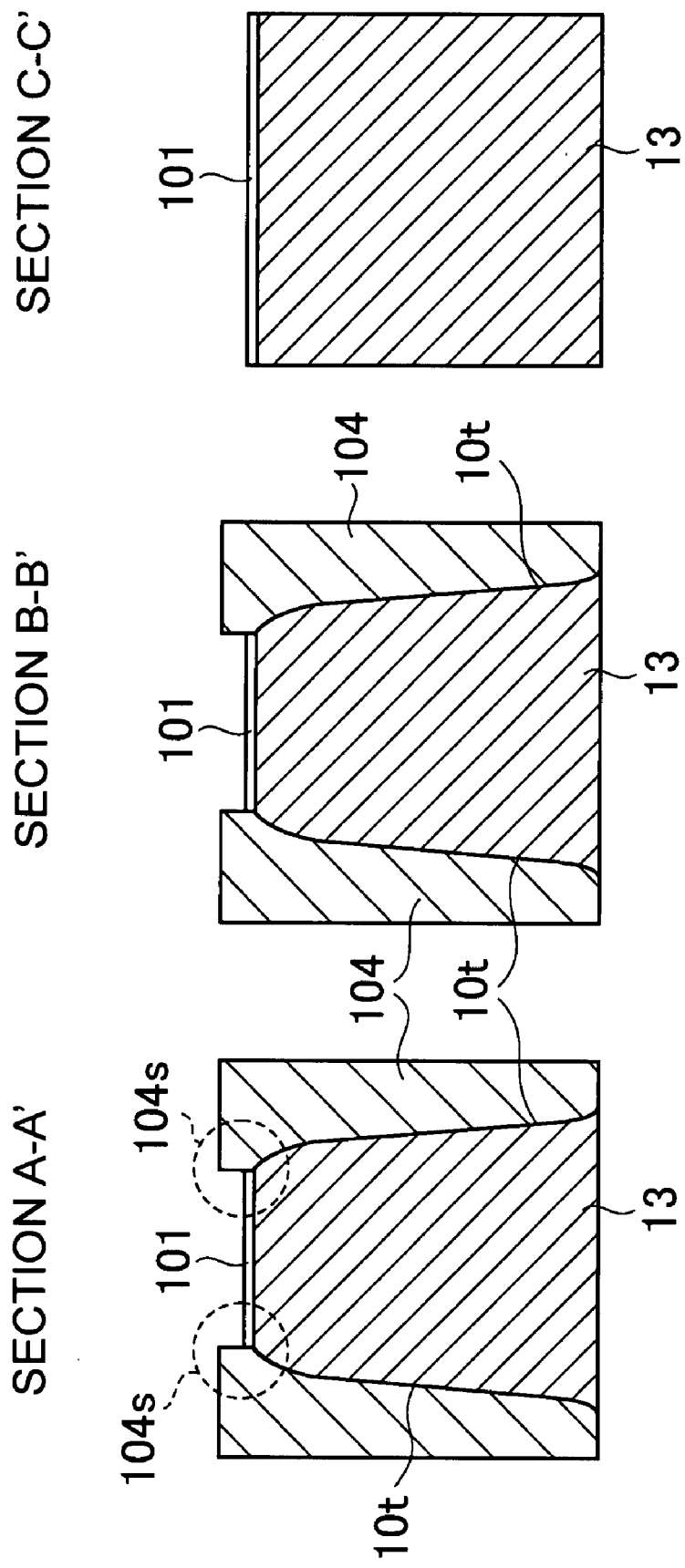
FIG. 7 is a cross-sectional view showing one process (etching of the silicon oxide film 104 and removing of the silicon nitride film 102) in the method of manufacturing the semiconductor device according to the embodiment of the present invention.

After the CMP, an upper portion of the silicon oxide film 104 is removed by wet etching, and the silicon nitride film 102 is removed by wet etching using a hot phosphoric acid at about 160° C. as shown in FIG. 7. As a result, the STI region 10 (that is, the silicon oxide film 104) and the active regions 11 surrounded and separated from one another by the STI region 10 shown in FIGS. 1A and 1B are completed. At this time, as shown in the section A-A' of FIG. 7, the wet etching performed to the silicon oxide film 104 is controlled so that upper end of the silicon oxide film 104 is lapped on an upper end of each active region 11 of the semiconductor substrate 13 and so that the upper end of the silicon oxide film 104 includes shoulders 104s almost perpendicular to the semiconductor substrate 13. A height difference of the each shoulder 104s from the upper end of the semiconductor substrate 13 is preferably set to about 30 nm.

Figure 8:
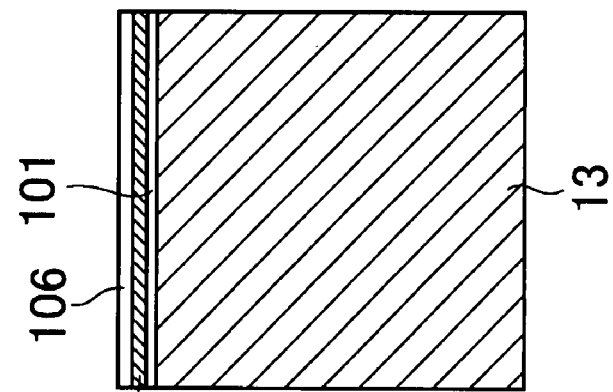
FIG. 8 is a cross-sectional view showing one process (formation of a silicon nitride film 105 and a silicon oxide film 106) in the method of manufacturing the semiconductor device according to the embodiment of the present invention.
Figure 8:
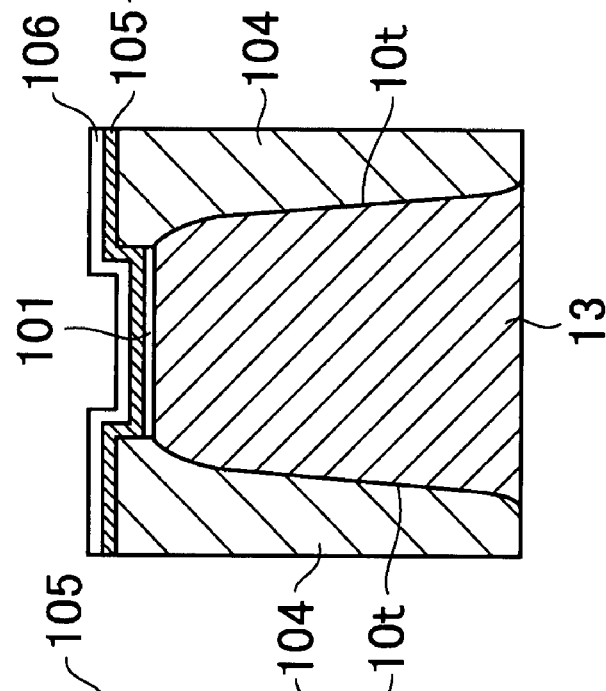
Figure 8:
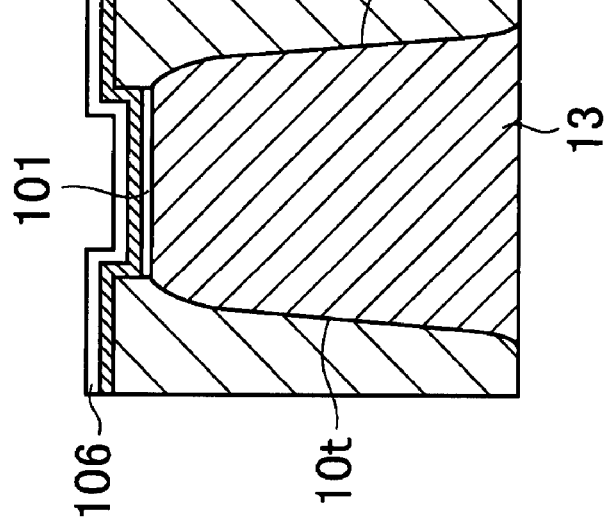

As shown in FIG. 8, a silicon nitride film 105 having a thickness of about 5 nm and a silicon oxide film 106 having a thickness of about 5 nm are formed on the entire surface in this order. It is to be noted that the thickness of the silicon nitride film 105 can be changed within a range from 5 nm to 10 nm. Further, the thickness of the silicon oxide film 106 can be changed within a range from 5 nm to 30 nm.

Figure 9:
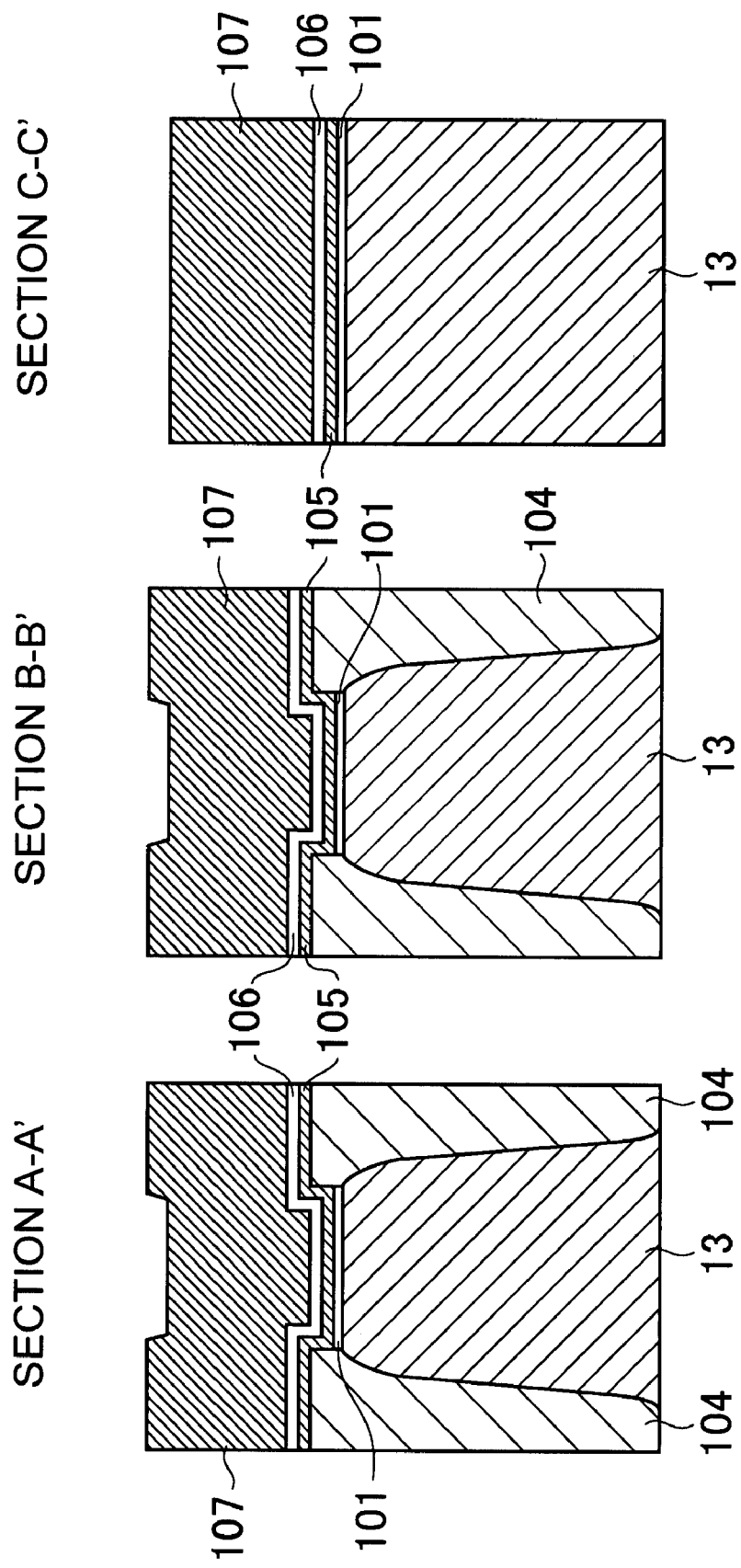
FIG. 9 is a cross-sectional view showing one process (formation of a silicon nitride film 107) in the method of manufacturing the semiconductor device according to the embodiment of the present invention.

As shown in FIG. 9, a silicon nitride film 107 having a thickness of about 120 nm and serving as a hard mask during formation of the gate trenches 12 (see FIGS. 1 to 3) is formed on the entire surface.

Figure 10:
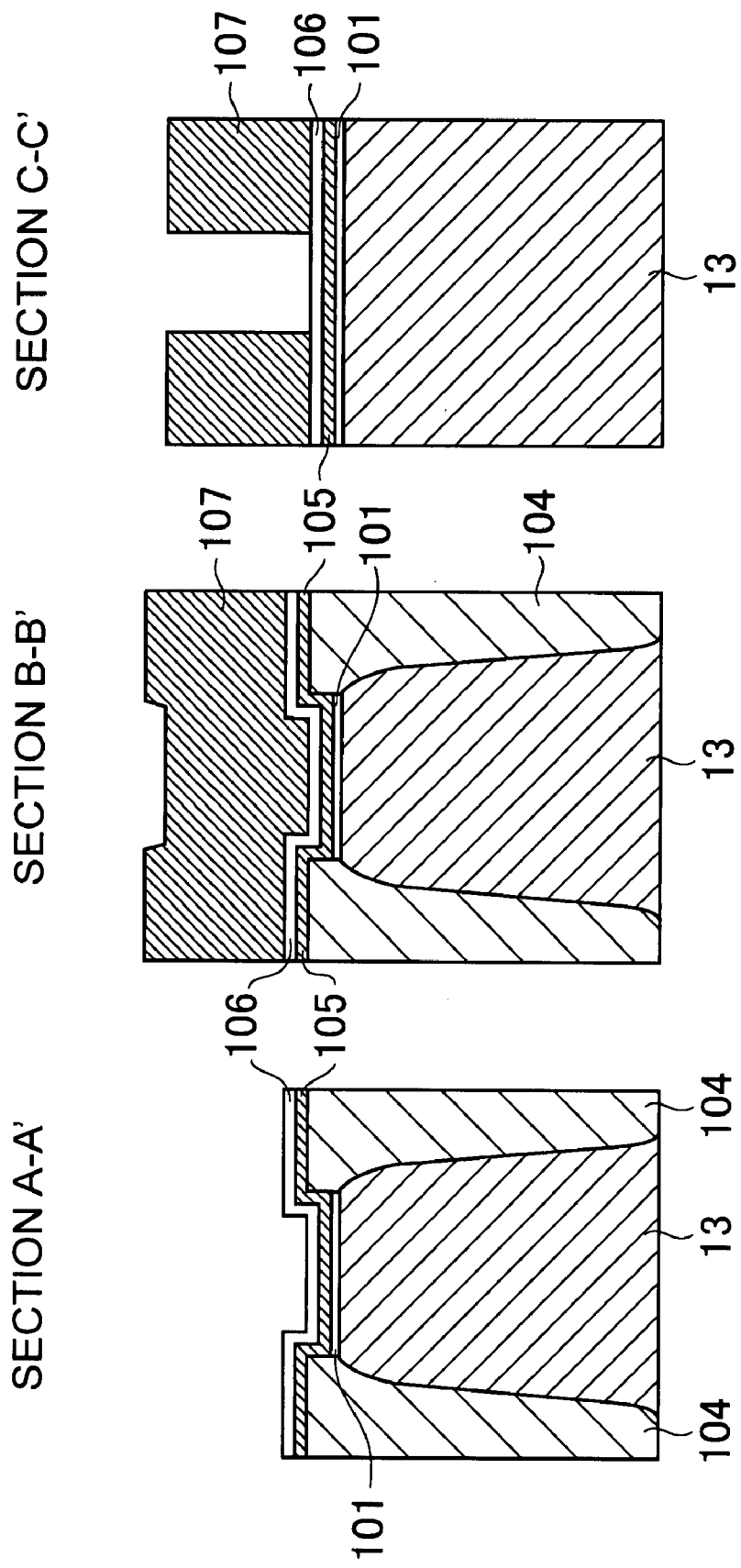
FIG. 10 is a cross-sectional view showing one process (patterning of the silicon nitride film 107) in the method of manufacturing the semiconductor device according to the embodiment of the present invention.

As shown in FIG. 10, the silicon nitride film 107 is patterned by dry etching so as to form openings on regions in which the gate trenches 12 are to be formed using a photoresist (not shown). By doing so, the silicon nitride film 107 becomes a mask layer including the openings each corresponding to a width of each gate trench 12. At this time, the silicon oxide film 106 is formed under the silicon nitride film 107. Due to this, the dry etching performed to the silicon nitride film 107 can be finished when the silicon oxide film 106 is exposed to bottoms of the openings. Namely, the silicon oxide film 106 functions as a dry etching stopper (protection film) when the openings are formed in the silicon nitride film 107. To dry-etch the silicon nitride film 107, anisotropic dry etching can be performed using a mixture gas of $CF_4$ and $CHF_3$ under conditions that an etch rate ratio of an etch rate of etching the silicon nitride film 107 to an etch rate of etching the silicon oxide films is higher than 8.

Figure 11:
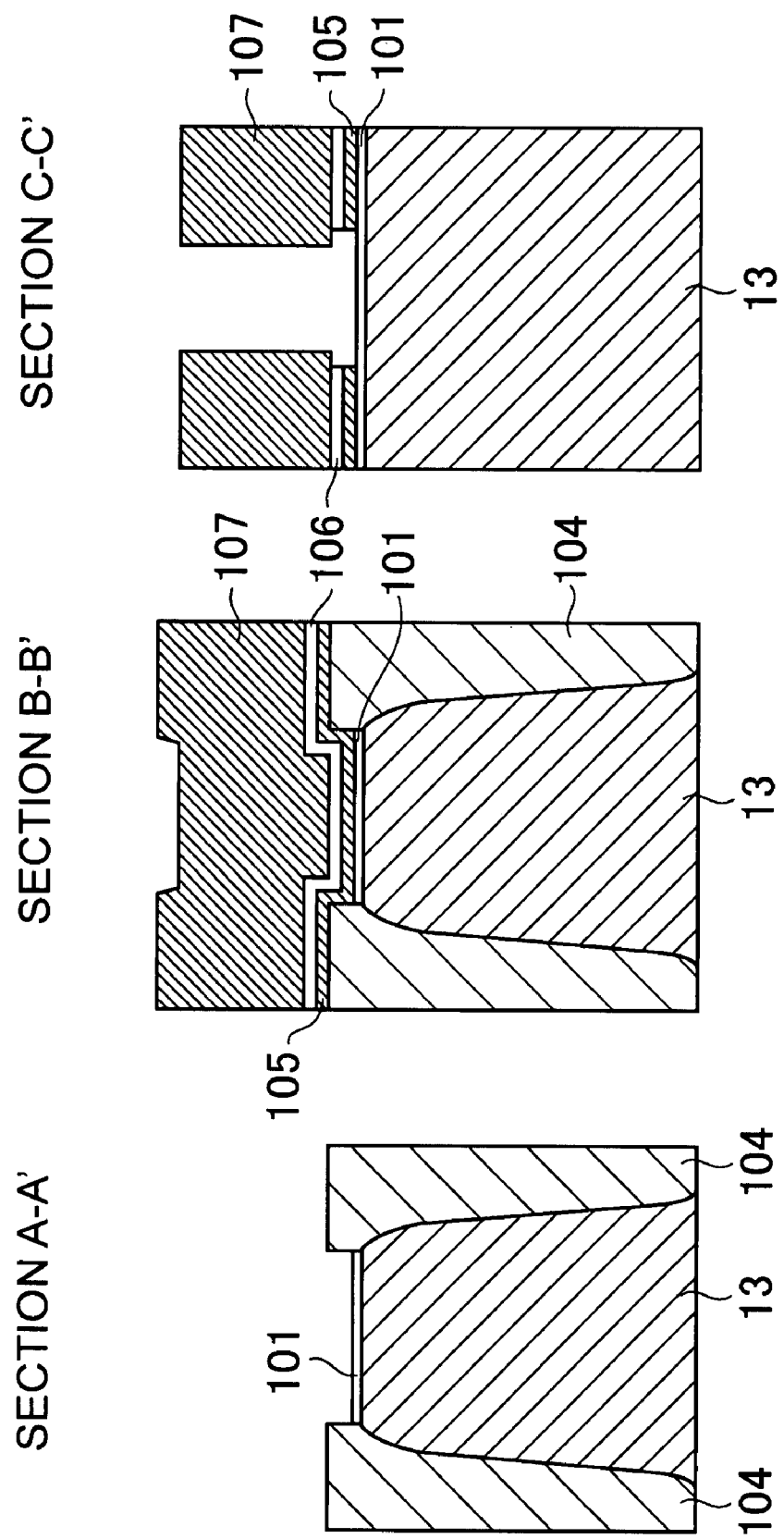
FIG. 11 is a cross-sectional view showing one process (removing of the silicon nitride film 105 and the silicon oxide film 106) in the method of manufacturing the semiconductor device according to the embodiment of the present invention.

As shown in FIG. 11, the silicon oxide film 106 exposed to the bottoms of the openings of the silicon nitride film (hard mask) 107 is removed by wet etching. At this time, the silicon nitride film 105 functions as an etching stopper during the wet etching performed to the silicon oxide film 106. Next, the silicon nitride film 105 having the thickness of 5 nm is removed using the hot phosphoric acid at 140° C. At this time, the silicon nitride film 107 has a sufficient thickness and can be, therefore, left unetched.

Figure 12:
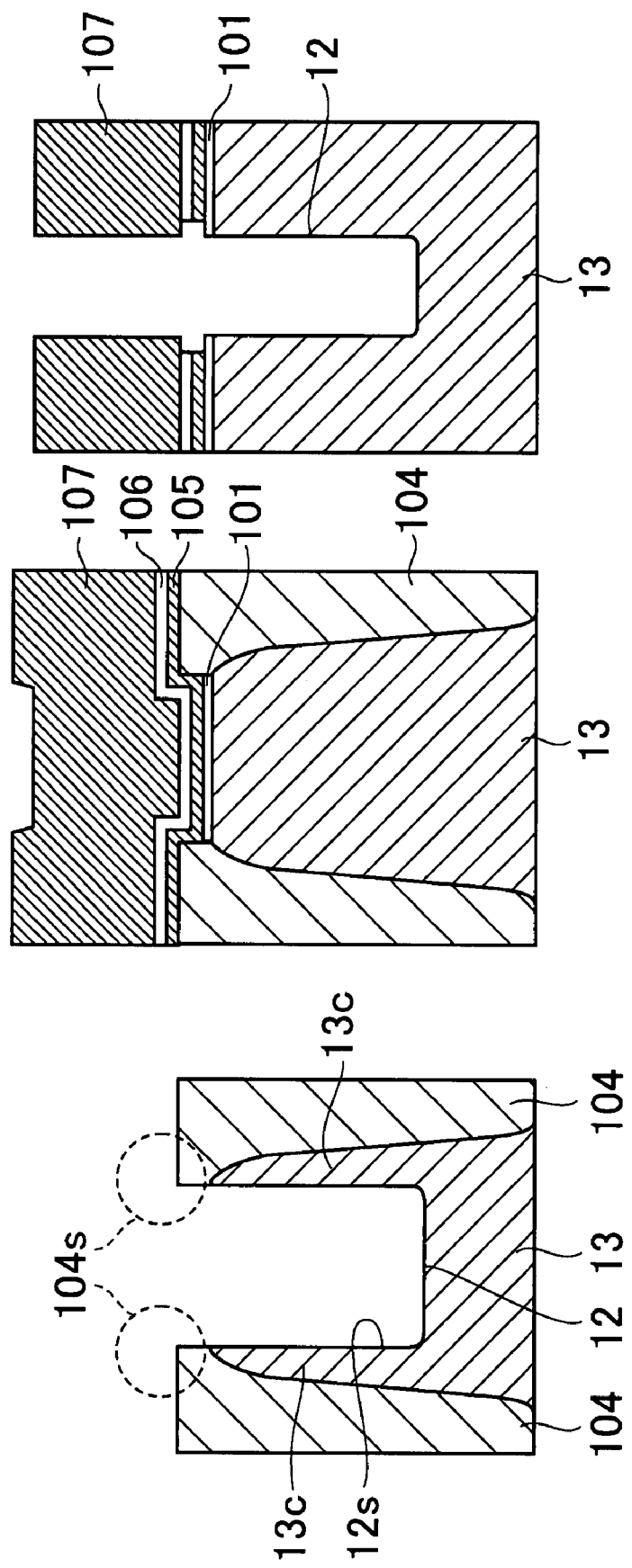
FIG. 12 is a cross-sectional view showing one process (formation of a gate trench 12) in the method of manufacturing the semiconductor device according to the embodiment of the present invention.

As shown in FIG. 12, while using the silicon nitride film 107 as a mask, the pad oxide film 101 is removed first by dry etching. As an etching gas used in the dry etching, a gas mixture of, for example, $CF_4$, $CHF_2$, and Ar can be used. Next, the dry etching is switched to dry etching at a high selectivity with respect to the silicon nitride film 107 and the silicon oxide film 104 that constitutes the STI region 10. While the silicon nitride film 17 is used as a mask, the semiconductor substrate 13 is dry-etched, thereby forming the gate trenches 12 each having a thickness of about 140 nm. To form the gate trenches 12, anisotropic dry etching can be performed using a gas mixture of, for example, $Cl_2$, HBr, and $O_2$ under conditions that an etch rate ratio of an etch rate of etching the semiconductor substrate 13 to an etch rate of etching the silicon oxide film 104 is higher than 20.

The dry etching for forming the gate trenches 12 has a high selectivity not only with respect to the silicon nitride film 105 but also with respect to the silicon oxide film 104. Due to this, because of the presence of the shoulders 104s of the silicon oxide film 104, the shoulders 104s function as a mask and the parts 13c of the semiconductor substrate 13 are left thin on the both sides of the gate trenches 12 as shown in the section A-A' of FIG. 12. A thickness of each of the parts 13c of the semiconductor substrate 13 left thin is about 15 nm to 35 nm. The shoulders 104s of the silicon oxide film 104 are almost perpendicular to the semiconductor substrate 13 as stated above. It is thereby possible to form the side surfaces 12s of the gate trenches 12 almost perpendicularly to the semiconductor substrate 13 as shown in the section A-A' of FIG. 12.

Figure 13:
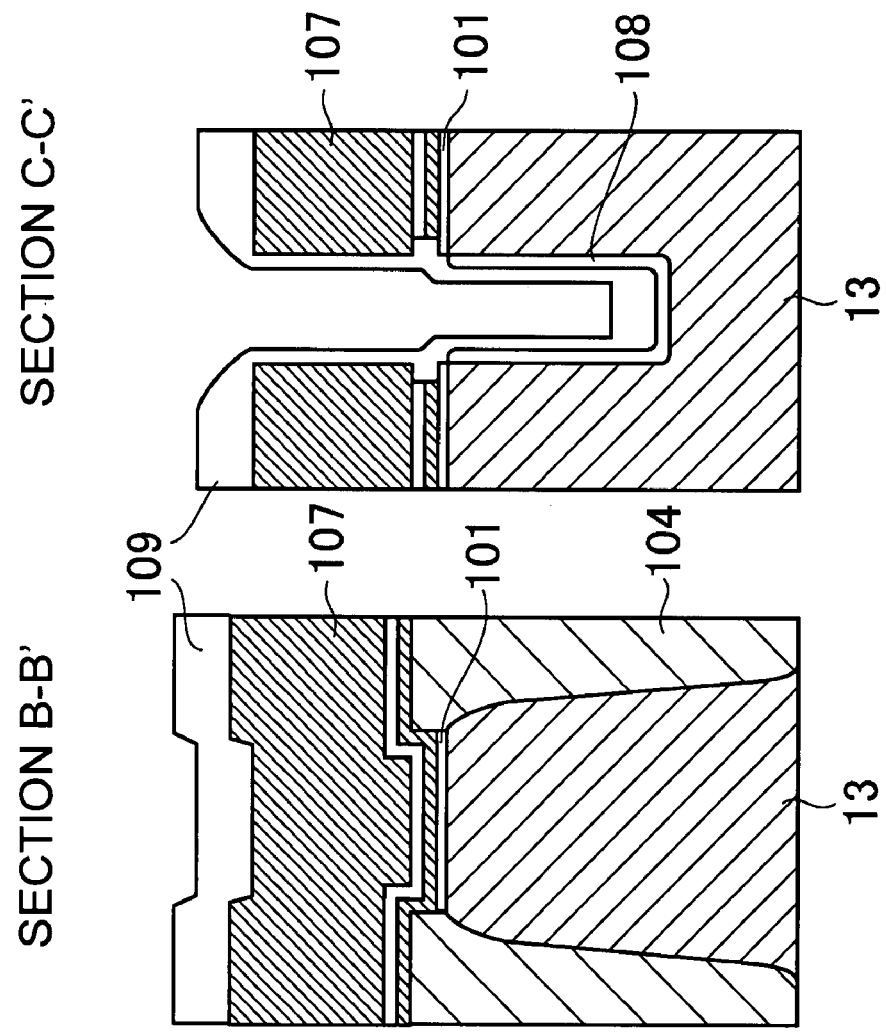
FIG. 13 is a cross-sectional view showing one process (formation of a sacrificial oxide film 108 and a silicon oxide film 109) in the method of manufacturing the semiconductor device according to the embodiment of the present invention.
Figure 13:
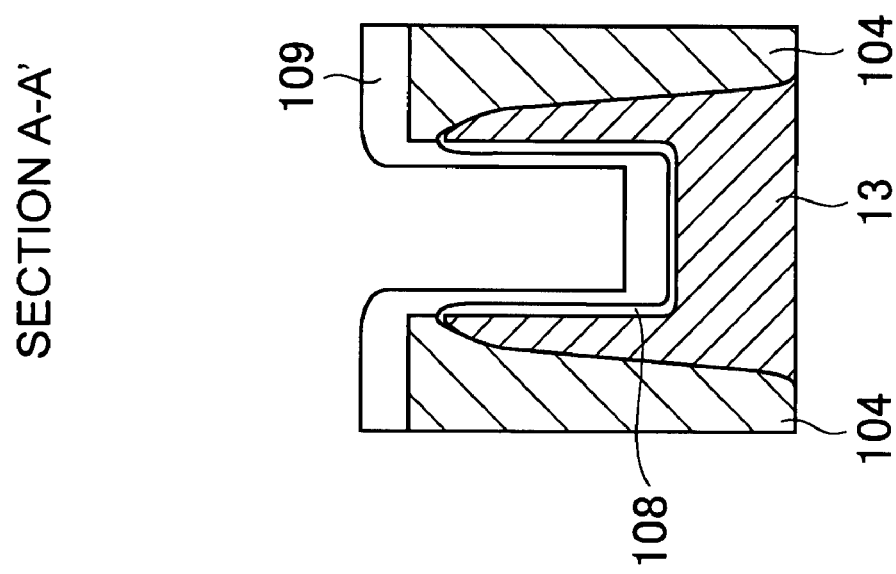

As shown in FIG. 13, a sacrificial oxide film 108 having a thickness of about 10 nm is formed on an inner surface of each of the gate trenches 12 by thermal oxidation. Thereafter, a silicon oxide film 109 having a thickness of about 50 nm is formed on the entire surface by the HDP-CVD. At this time, due to characteristics of the HDP-CVD, the silicon oxide film 109 is formed thick on flat parts, that is, bottoms of the gate trenches 12, an upper surface of the silicon oxide film 104, and an upper surface of the silicon nitride film 107, and formed thin on the side surfaces of the gate trenches 12.

Figure 14:
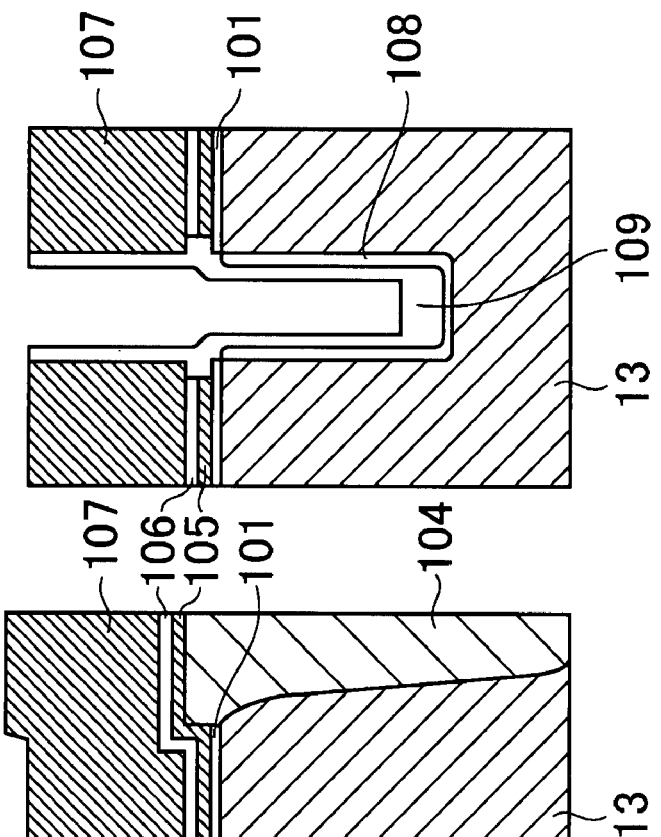
FIG. 14 is a cross-sectional view showing one process (selectively removing of the silicon oxide film 109) in the method of manufacturing the semiconductor device according to the embodiment of the present invention.
Figure 14:
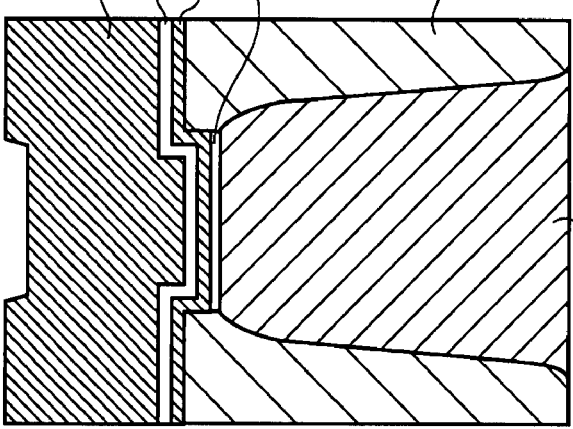
Figure 14:
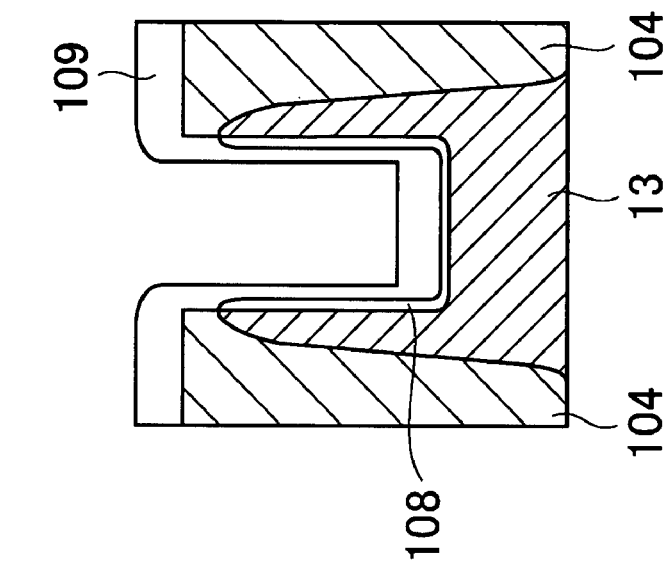

As shown in FIG. 14, the silicon oxide film 109 on the silicon nitride film 107 is removed by the CMP.

Figure 15:
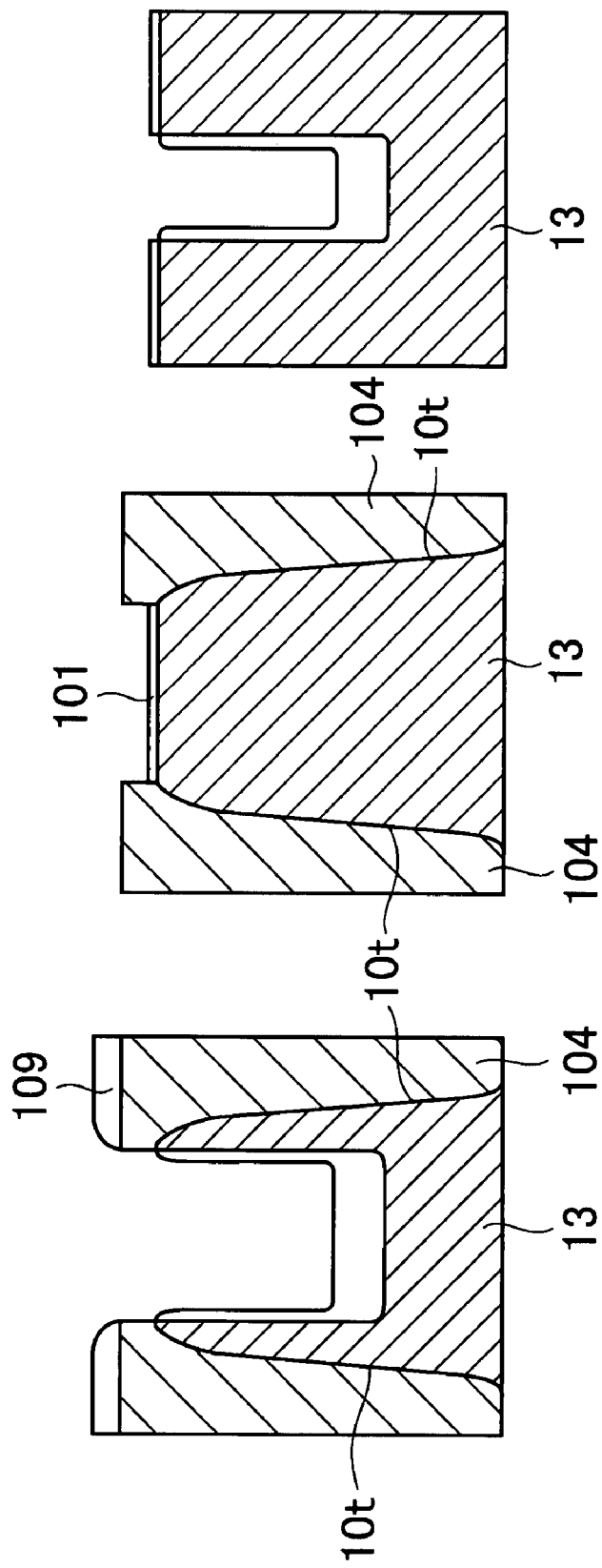
FIG. 15 is a cross-sectional view showing one process (removing of the silicon nitride film 107, the silicon oxide film 106 and the silicon nitride film 105) in the method of manufacturing the semiconductor device according to the embodiment of the present invention.

Next, wet etching is performed for short time using hydrogen fluoride or the like to remove the thin silicon oxide film 109 on side surfaces of the openings of the silicon nitride film 107. Thereafter, as shown in FIG. 15, the silicon nitride film 107 is removed by wet etching using hot phosphoric acid.

Figure 16:
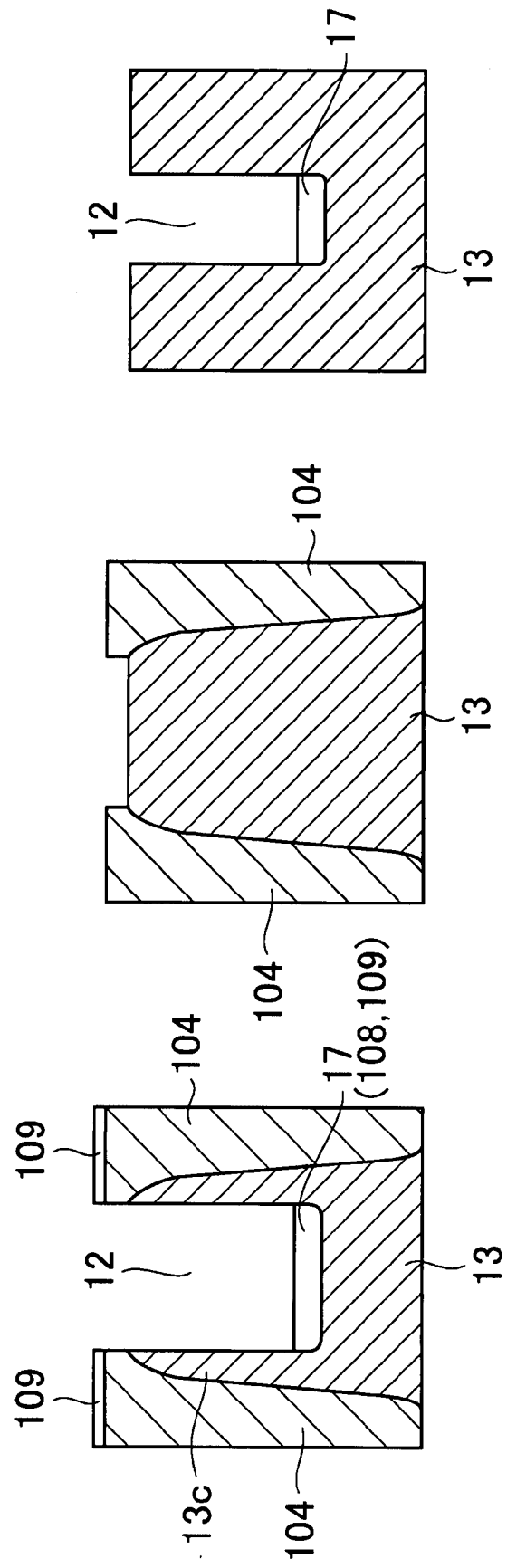
FIG. 16 is a cross-sectional view showing one process (removing of the pad oxide film 101 and the sacrificial oxide film 108) in the method of manufacturing the semiconductor device according to the embodiment of the present invention.

As shown in FIG. 16, the side surfaces of the gate trenches 12 and the pad oxide film 101 are removed by wet etching. At this time, an upper surface of the silicon oxide film 109 on the bottoms of the trenches 12 is also etched to be thin. Conditions for the wet etching, e.g., etching time are set so that the thickness of the silicon oxide film 109 (including the thickness of the sacrificial oxide film 108) is larger than that of a gate insulating film to be formed later on the side surface of each of the gate trenches 12. As a result, a thick insulating film 17 (including the sacrificial oxide film 108) having a thickness of about 20 nm to 30 nm is formed on the bottom of each gate trench 12. Because of forming the thick insulating film 17 on the bottom of each gate trench 12, the silicon oxide film 109 is left on the upper surface of the silicon oxide film 104. However, the silicon oxide film 109 on the upper surface of the silicon oxide film 104 has no adverse effect on the semiconductor device according to the embodiment. Therefore, the silicon oxide film 109 on the upper surface of the silicon oxide film 104 can be left without removing it.

Figure 17:
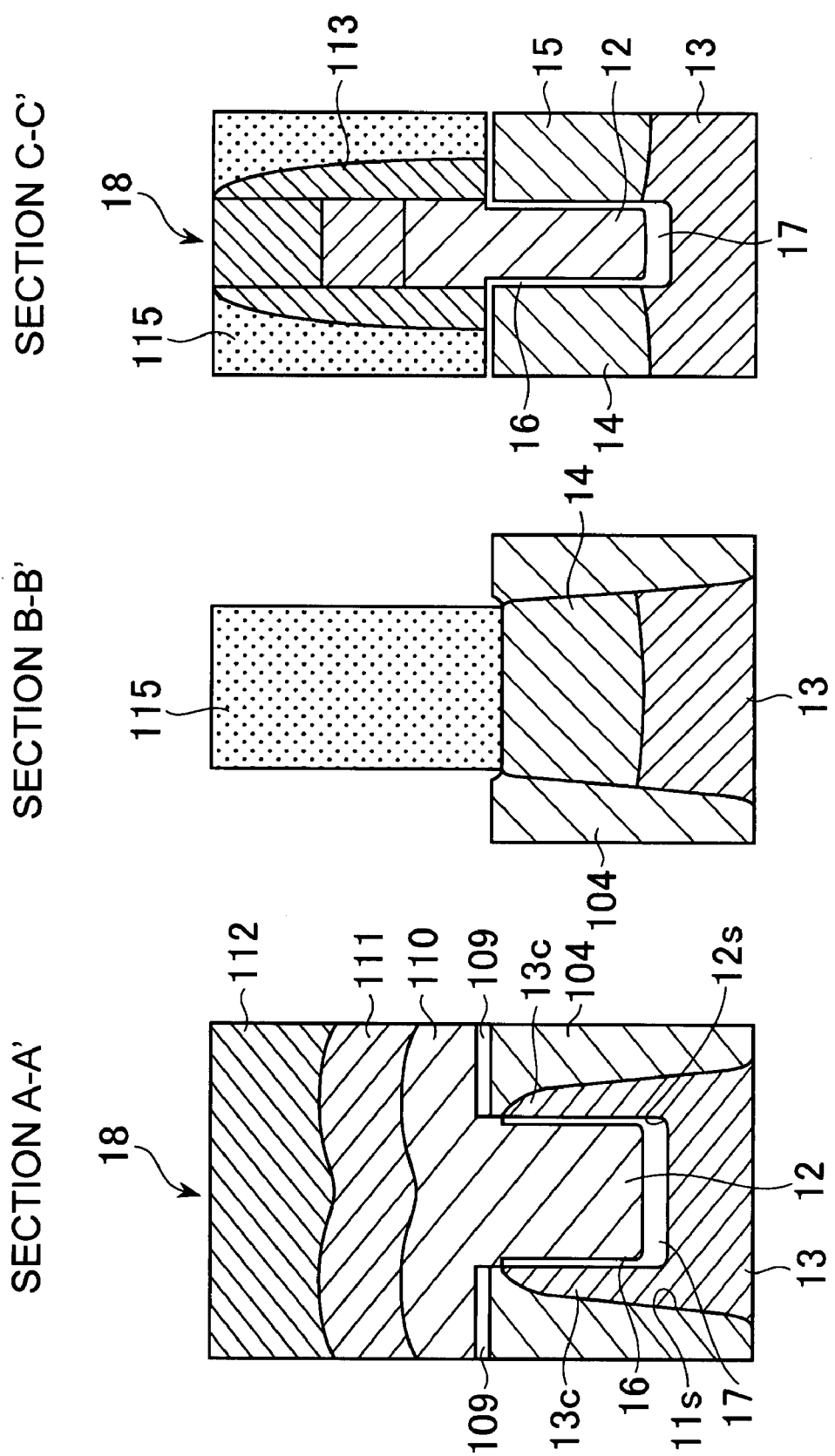
FIG. 17 is a cross-sectional view showing one process (formation of a gate electrode 18, formation of side wall insulation films 113, formation of a source region 14 and a drain region 15 and formation of a contact plug 115) in the method of manufacturing the semiconductor device according to the embodiment of the present invention.

Thereafter, as shown in FIG. 17, a gate insulating film 16 having a thickness of about 8 nm is formed on the entire surface including the side surfaces of the gate trenches 12 and an upper part of the semiconductor substrate 13 in a peripheral circuit region. A doped polysilicon (DOPOS) film 110 having a thickness of about 100 nm is formed on the entire surface including interiors of the gate trenches 12. A W/WN film 111 in which a tungsten (W) film having a thickness of about 70 nm is formed on a tungsten nitride (WN) film having a thickness of about 5 nm as a metal layer, and a silicon nitride film 112 having a thickness of about 140 nm are formed on the DOPOS film 110 in this order. Multilayer films of the DOPOS film 110, the W/WN film 111, and the silicon nitride film 112 are patterned into gate electrode shapes. As a result, the gate electrodes 18 each including a first part in which a part of the DOPOS film 110 is buried in the gate trench 12 and a second part continuous to the first part and protruding from the surface of the semiconductor substrate 13 are completed.

As shown in FIG. 17, while using the gate electrodes 18 of the memory cell transistor as a mask, impurity ions are implanted into the semiconductor substrate 13, thereby forming the source and drain regions 14 and 15 each having a thickness of about 80 nm on both sides of each of the gate trenches 12 in the extension direction of the gate trenches 12, respectively.

Next, sidewall insulating films 113 having a thickness of about 25 nm are formed on side surfaces of the trench gates 18, and contact plugs 115 are then formed.

Thereafter, although not shown in the drawings, memory cell capacitors, wirings and the like are formed by ordinary method, thus completing the DRAM.

As stated so far, according to the embodiment, the side of the channel region 13c located between the side surface 11s of the silicon oxide film 104 and the side surface 12s of each gate trench 12, which side is adjacent to each gate trench 12, can be made almost perpendicular to the semiconductor substrate 13 as shown in the section A-A' of FIG. 17. Namely, as shown in FIGS. 9 and 10, when the silicon nitride film 107 is dry-etched to form the hard mask, it is possible to prevent the corners on the upper ends of the silicon oxide film (STI regions) 104 from being chipped because the surfaces of the semiconductor substrate 13 and the STI region 104 are covered with the silicon nitride film 105 and the silicon oxide film 106 in the section A-A'. It is thereby possible to prevent the channel regions 13c from being tapered to the gate trench 12-side. Accordingly, it is possible to suppress irregularities in thickness and depth (width) of the channel regions 13c among a plurality of transistors.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

For example, while the example of applying the present invention to the memory cell transistor in the DRAM has been described in the embodiment, the present invention is not limited to the memory but is applicable to logic-related devices.

What is claimed is:

1. A method of manufacturing a semiconductor device, comprising:
    a first step of forming an STI (Shallow Trench Isolation) region includes a first insulating film and an active region surrounded by the STI region on a semiconductor substrate so that an upper end of the first insulating film is lapped on an upper end of the active region and so as to include a shoulder part, the shoulder part having a surface being almost perpendicular to the semiconductor substrate;
    a second step of forming a second insulating film and a third insulating film in order on an entire surface including the shoulder part;
    a third step of forming a fourth insulating film on the third insulating film, the fourth insulating film serving as a hard mask when a gate trench is formed;
    a fourth step of performing a dry etching using the third insulating film as an etch stopper, and forming an opening in the fourth insulating film, the opening corresponding to a width of the gate trench;
    a fifth step of sequentially removing the third insulating film and the second insulating film exposed to a bottom of the opening; and
    a sixth step of forming the gate trench in the semiconductor substrate using the fourth insulating film as a part of a mask and the shoulder part of the STI region as another part of the mask, the shoulder part extending in an extension direction of the gate trench, and leaving a thin film part that is a part of the semiconductor substrate between the gate trench and the STI region.

2. The method of manufacturing the semiconductor device as claimed in claim 1, wherein
    the thin film part of the semiconductor substrate includes a surface almost perpendicular to the semiconductor substrate on a side of the gate trench.

3. The method of manufacturing the semiconductor device as claimed in claim 1, wherein
    the first insulating film and the third insulating film are silicon oxide films, and the second insulating film and the fourth insulating film are silicon nitride films.

4. The method of manufacturing the semiconductor device as claimed in claim 1, wherein
    the forming the gate trench is performed using an etching, which has a high selectivity with respect to both the fourth insulating film and the first insulating film.

5. The method of manufacturing the semiconductor device as claimed in claim 1, further comprising:
    a seventh step of forming a thick insulating film on a bottom of the gate trench; and
    an eighth step of forming a gate insulating film on a side surface of the gate trench, wherein
    the seventh step and the eighth step are performed after the sixth step, and the thick insulating film is thicker than the gate insulating film.

6. The method of manufacturing the semiconductor device as claimed in claim 2, further comprising:
    a seventh step of forming a thick insulating film on a bottom of the gate trench; and
    an eighth step of forming a gate insulating film on a side surface of the gate trench, wherein
    the seventh step and the eighth step are performed after the sixth step, and the thick insulating film is thicker than the gate insulating film.

7. The method of manufacturing the semiconductor device as claimed in claim 3, further comprising:
    a seventh step of forming a thick insulating film on a bottom of the gate trench; and
    an eighth step of forming a gate insulating film on a side surface of the gate trench, wherein
    the seventh step and the eighth step are performed after the sixth step, and the thick insulating film is thicker than the gate insulating film.

8. The method of manufacturing the semiconductor device as claimed in claim 4, further comprising:
    a seventh step of forming a thick insulating film on a bottom of the gate trench; and
    an eighth step of forming a gate insulating film on a side surface of the gate trench, wherein
    the seventh step and the eighth step are performed after the sixth step, and the thick insulating film is thicker than the gate insulating film.

9. The method of manufacturing the semiconductor device as claimed in claim 5, wherein
    the seventh step includes
    a step of depositing an insulating film at least on the side surface and the bottom of the gate trench by HDP (High Density Plasma)-CVD; and
    a step of removing the insulating film formed on the side surface of the gate trench by wet etching.

10. The method of manufacturing the semiconductor device as claimed in claim 5, wherein
    a region under the thick insulating film on the bottom of the gate trench does not serve as a channel region.

11. The method of manufacturing the semiconductor device as claimed in claim 6, wherein
    a region under the thick insulating film on the bottom of the gate trench does not serve as a channel region.

12. The method of manufacturing the semiconductor device as claimed in claim 7, wherein a region under the thick insulating film on the bottom of the gate trench does not serve as a channel region.

13. The method of manufacturing the semiconductor device as claimed in claim 8, wherein
a region under the thick insulating film on the bottom of the gate trench does not serve as a channel region.

14. A method of manufacturing a semiconductor device, comprising:
a first step of forming an STI (Shallow Trench Isolation) region and an active region surrounded by the STI region on a semiconductor substrate;
a second step of forming a protection film protecting a shoulder part of the STI region in a boundary between the active region and the STI region;
a third step of forming a gate trench, using the shoulder part as a mask, in the active region so as to leave a part of the semiconductor substrate located between a side surface of the STI region and a side surface of the gate trench;
a fourth step of forming a gate insulating film on the side surface of the gate trench;
a fifth step of forming a gate electrode, at least a part of the gate electrode being buried in the gate trench; and
a sixth step of forming a source region and a drain region in regions located on both sides of the gate trench in an extension direction of the gate trench, respectively, so that the part of the semiconductor substrate functions as a channel region.

15. The method of manufacturing the semiconductor device as claimed in claim 14, wherein
a part of the protection film is removed after the second step and before the third step, the part of the protection film being where the gate trench is formed in the third step.

16. The method of manufacturing the semiconductor device as claimed in claim 14, wherein
the protection film includes a plurality of insulating films different in material.

17. The method of manufacturing the semiconductor device as claimed in claim 15, wherein
the protection film includes a plurality of insulating films different in material.

18. The method of manufacturing the semiconductor device as claimed in claim 16, wherein
at least one insulating film of the plurality of insulating films included in the protection film is made of a material different from a material of a mask used at the third step.

19. The method of manufacturing the semiconductor device as claimed in claim 17, wherein
at least one insulating film of the plurality of insulating films included in the protection film is made of a material different from a material of a mask used at the third step.

* * * * *